United States Patent
Wadhwa et al.

(10) Patent No.: US 9,654,096 B1
(45) Date of Patent: May 16, 2017

(54) LOW VARIATION POWER-ON-RESET CIRCUIT

(71) Applicant: FREESCALE SEMICONDUCTOR, INC., Austin, TX (US)

(72) Inventors: Sanjay K. Wadhwa, Noida (IN); Divya Tripathi, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/214,336

(22) Filed: Jul. 19, 2016

(51) Int. Cl.
H03L 7/00 (2006.01)
H03K 17/22 (2006.01)
H03K 17/284 (2006.01)
H03K 17/14 (2006.01)

(52) U.S. Cl.
CPC ......... H03K 17/223 (2013.01); H03K 17/145 (2013.01); H03K 17/284 (2013.01)

(58) Field of Classification Search
CPC ........ H03K 4/50; H03K 17/223; H03K 5/135; G06F 1/10
USPC ................................................ 327/140–143
See application file for complete search history.

(56) References Cited

U.S. PATENT DOCUMENTS

| | | | |
|---|---|---|---|
| 5,180,926 A * | 1/1993 | Skripek | H03K 17/223 327/143 |
| 5,243,233 A | 9/1993 | Cliff | |
| 6,181,173 B1 | 1/2001 | Homol et al. | |
| 6,181,628 B1 | 1/2001 | Reynolds | |
| 6,185,129 B1 * | 2/2001 | Seo | G11C 16/30 365/185.18 |
| 6,362,669 B1 | 3/2002 | Zhou et al. | |
| 6,744,291 B2 | 6/2004 | Payne et al. | |
| 7,161,396 B1 | 1/2007 | Zhou et al. | |
| 8,680,901 B2 | 3/2014 | Shrivastava et al. | |
| 9,143,137 B2 | 9/2015 | Gonzalez | |
| 2005/0001660 A1 | 1/2005 | Roy | |

FOREIGN PATENT DOCUMENTS

JP   02003032088   *   1/2003

* cited by examiner

*Primary Examiner* — Dinh T Le
(74) *Attorney, Agent, or Firm* — Charles E. Bergere

(57) ABSTRACT

A power-on-reset (POR) circuit for a system-on-chip (SOC) includes a biased switching element having a source, drain, and gate, with the source being connected to a supply voltage and the drain and gate being connected to a control line. The POR circuit further includes a first delay switching element having a source connected to a reduced supply voltage, a gate connected to the control line, and a drain, and an inverter having an input and an output, with the input being connected to the drain of the first delay switching element. The inverter includes a first CMOS inverter coupled between the supply voltage and a reference voltage. A first capacitor is coupled between the inverter input and the reference voltage. A second capacitor coupled between the inverter input and an output of the first CMOS inverter.

9 Claims, 2 Drawing Sheets

LOW VARIATION POWER-ON-RESET CIRCUIT

BACKGROUND

The present invention is directed to power-on-reset circuits and, more particularly, to power-on-reset circuits having low variation in de-assertion threshold voltage.

Power-on-reset (POR) circuits are used in devices such as a system-on-chip (SOC) to keep flip-flops and other sequential elements in a known state (e.g., set or reset) until a proper supply level is reached on start-up. Generally, during power supply ramp-up, the output signal of the POR circuit is kept low. The supply voltage level during ramp-up at which the POR circuit output signal "de-asserts" (i.e., switches to high logic level) is referred to as the de-assertion threshold. FIG. 1 shows an example of a supply voltage level and POR circuit output signal level over time during a ramp-up period.

In a conventional POR circuit, de-assertion occurs while the supply voltage is still climbing, and there can be a wide variation in the de-assertion threshold. Such variation is detrimental to the assurance of a reliable start-up under varying ramp rate conditions.

FIG. 2 is a schematic circuit diagram of a conventional POR circuit 10. The signal por_b on output 12 of the circuit 10 goes high when a supply voltage VDD_POR crosses the de-assertion threshold, which is set by a voltage divider 14 (formed by two resistors 16, 17 and a resistance Rds of a plurality of NMOS transistors 18 connected in series) and a switching threshold of a first inverter 20. The typical de-assertion threshold for a POR circuit implemented in 28 nm CMOS process, for example, is about 700 mV. However, since the POR circuit 10 is an open loop (i.e., no feedback), the threshold can vary significantly across process and temperature variations. For example, the threshold of a POR circuit designed in 28 nm CMOS technology can vary between 500 mV-700 mV.

It is therefore desirable to provide a POR circuit that reduces de-assertion threshold voltage variations while also reducing silicon area.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION

In one embodiment, the present invention provides a power-on-reset (POR) circuit for a system-on-chip (SOC). The POR circuit includes a biased switching element having a source, a drain, and a gate, with the source being connected to a supply voltage, and the drain and gate being connected to a control line. The POR circuit further includes a first delay switching element having a source connected to a reduced supply voltage, a gate connected to the control line, and a drain, and an inverter having an input and an output, with the input of the inverter being connected to the drain of the first delay switching element. The inverter includes a first CMOS inverter coupled between the supply voltage and a reference voltage. A first capacitor is coupled between the inverter input and the reference voltage. A second capacitor is coupled between the inverter input and an output of the first CMOS inverter.

In another embodiment, the present invention provides a POR circuit for a SOC. The POR circuit includes a biased switching element having a source, a drain, and a gate, with the source being connected to a supply voltage, and the drain and gate being connected to a control line. A plurality of delay switching elements have sources and drains thereof connected in series with one another and with a reduced supply voltage. Each of the plurality of delay switching elements has a gate connected to the control line. An inverter has an input and an output. The inverter includes a plurality of CMOS inverters having inputs and outputs thereof connected in series with one another between the input and the output of the inverter. Each of the CMOS inverters is coupled between the supply voltage and a reference voltage. The input of the inverter is connected to a drain of one of the plurality of delay switching elements. A first capacitor is coupled between the inverter input and the reference voltage. A second capacitor is coupled between the inverter input and an output of a first one of the plurality of CMOS inverters in the series connection.

Figure 3:
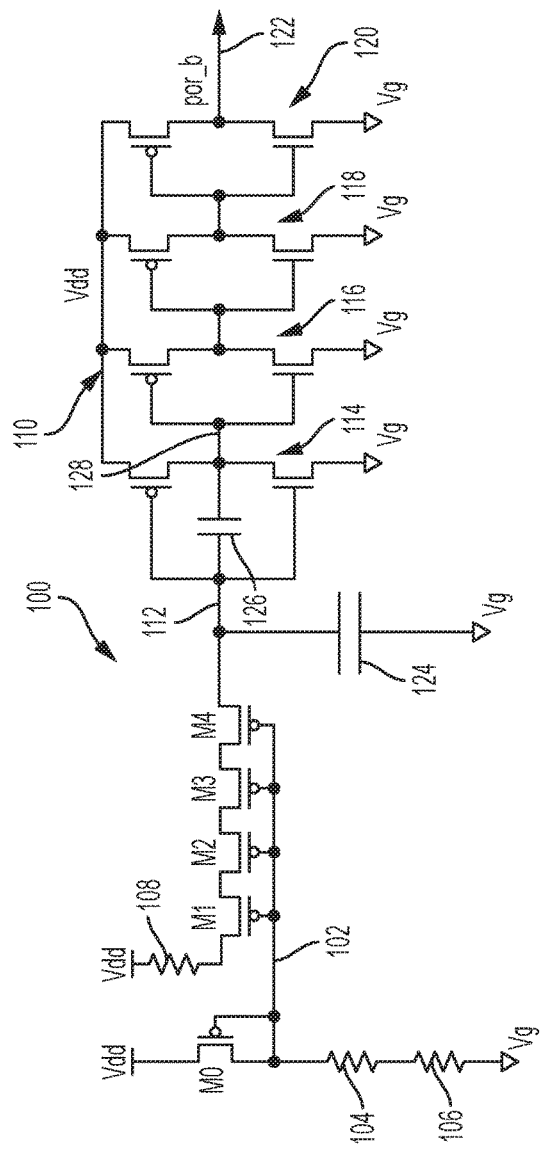
FIG. 3 is a schematic circuit diagram of a POR circuit in accordance with a preferred embodiment of the present invention.

Referring now to the drawings, wherein the same reference numerals are used to designate the same components throughout the several figures, there is shown in FIG. 3 a preferred embodiment of a POR circuit 100 in accordance with the present invention for use with an SOC having additional components (not shown). The POR circuit 100 includes a biased switching element, preferably in the form of a PMOS transistor M0, having a source connected to a supply voltage Vdd of the SOC, and further includes a drain and a gate connected to a control line 102. The PMOS transistor M0 is preferably biased by one or more bias resistors 104, 106 coupled between the control line 102 (i.e., coupled to the drain of the PMOS transistor M0) and a reference voltage Vg of the SOC (e.g., ground).

At least one, and preferably a plurality, of delay switching elements M1, M2, M3, M4 are provided. If multiple delay switching elements M1, M2, M3, M4 are present, the sources and drains of each are preferably connected in series with one another, with the source of the first switching element M1 in the series being connected to a reduced form of the supply voltage Vdd. The reduction from the supply voltage Vdd is preferably performed by one or more resistors 108 connected in series between the supply voltage Vdd and the source of the first delay switching element M1. This is known as source degeneration and it helps in reducing the spread in the resistance value of the delay switching elements M1-M4. The gate of each of the delay switching elements M1, M2, M3, and M4 is connected to the control line 102.

Each of the delay switching elements M1-M4 is preferably a PMOS transistor. While four delay switching elements M1, M2, M3, M4 are shown in FIG. 3, the number may be varied depending on the application (e.g., the maximum ramp rate to be supported) to increase or decrease the effective length and hence the resistance provided by the delay switching elements M1-M4.

The drain of the final delay switching element M4 is connected to an input 112 of an inverter 110. The inverter 110 preferably includes at least one, and preferably a plurality, of CMOS inverters 114, 116, 118, 120, all of which are coupled between the supply voltage Vdd and the reference voltage Vg. Where multiple CMOS inverters 114, 116, 118, 120 are utilized, inputs and outputs thereof are preferably connected in series between the ultimate input 112 and final output 122 of the overall inverter 110. While four CMOS inverters 114, 116, 118, 120 are shown in FIG. 3, the number of CMOS inverters is dependent on the capacitive load on the POR circuit 100 output signal por_b.

A first capacitor 124 is provided coupled between the inverter input 112 and the reference voltage Vg. A second capacitor 126 is coupled between the inverter input 112 and an output 128 of the first CMOS inverter 114. The second capacitor 126 allows the POR circuit 100 to leverage the Miller effect to enhance the capacitance of the POR circuit 100 while significantly reducing the area consumed by capacitors in the system. The enhanced capacitance, aided by the connection of the second capacitor 126 across the first CMOS inverter 114, also helps achieve low variation in the delay prior to de-assertion by the POR circuit.

The POR circuit 100 according to embodiments of the present invention therefore adds a known delay time for de-assertion that is greater than the ramp-up time specification of the supply voltage Vdd. The POR circuit 100 output consequently de-asserts at a time when the supply voltage Vdd is ensured to have reached its final value (e.g., VDD).

Figure 1:
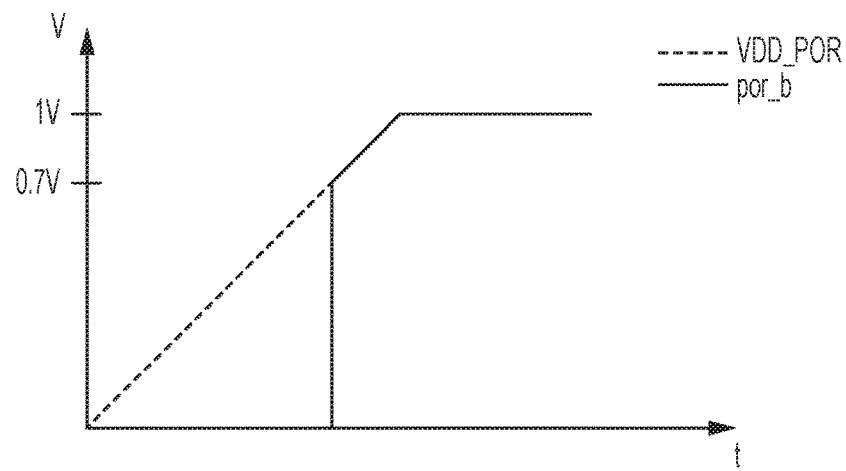
FIG. 1 is a plot of voltage over time for a supply signal VDD_POR and a POR circuit output signal por_b for a conventional POR circuit.
Figure 2:
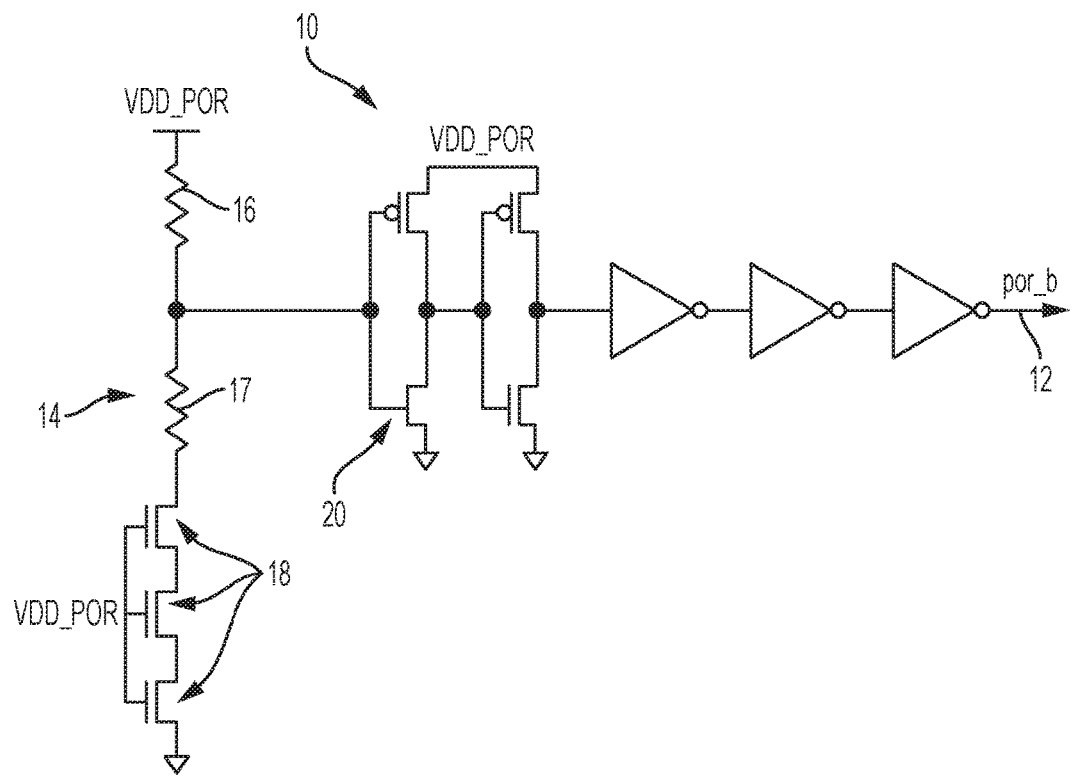
FIG. 2 is a schematic circuit diagram of a conventional POR circuit.
Figure 4:
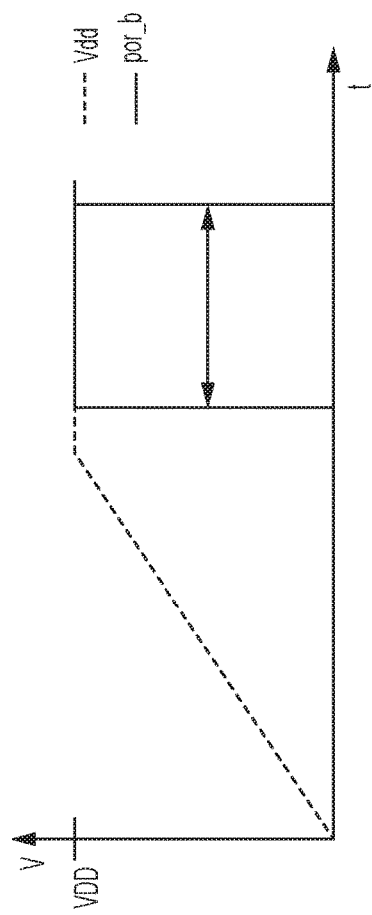
FIG. 4 is a plot of voltage over time for a supply signal Vdd and POR circuit output signal por_b for the POR circuit of FIG. 3.

FIG. 4 is a plot similar to that of FIG. 1, but for a POR circuit 100 according to embodiments of the present invention. As can be seen in FIG. 4, a de-assertion delay spread across process and temperature (indicated by the two vertical solid lines separated by a double-sided arrow) for the output signal por_b is located entirely after the supply voltage Vdd has reached is final value (VDD). An exemplary POR circuit 100 has been simulated across process, voltage, and temperature variations for SOCs with supply voltage Vdd ramp rates ranging from 100 µs to 25 ms. For supply voltage Vdd value of 720 mV and a 100 µs supply ramp rate (to go from 0V to 720 mV), the POR circuit 100 delays vary from about 16.5-42.2 ms. Similarly, for a 25 ms supply ramp rate, the POR circuit 100 delays vary from about 30.7-59.8 ms. Further, unlike the conventional POR circuit 10, the variation in the de-assertion threshold spread is eliminated, since it is always equal to the supply voltage Vdd.

In the foregoing specification, the invention has been described with reference to specific examples of embodiments of the invention. It will, however, be evident that various modifications and changes may be made therein without departing from the broader spirit and scope of the invention as set forth in the appended claims.

The connections discussed may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The switch elements are described in preferred embodiments as being transistors, but other types of switching circuitry, such as mechanical switches, relays, or the like, can also use these switching elements. In addition, while certain transistors are described as PMOS or NMOS type, the conductivities may be reversed in still keeping with the invention.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A power-on-reset circuit for a system-on-chip (SOC), the power-on-reset circuit comprising:
    a biased switching element having a source, a drain, and a gate, the source being connected to a supply voltage, and the drain and gate being connected to a control line;
    a first delay switching element having a source connected to a reduced supply voltage, a gate connected to the control line, and a drain;
    an inverter having an input and an output, the input of the inverter being connected to the drain of the first delay switching element, the inverter including a first CMOS inverter coupled between the supply voltage and a reference voltage;
    a first capacitor coupled between the inverter input and the reference voltage; and
    a second capacitor coupled between the inverter input and an output of the first CMOS inverter.

2. The power-on-reset circuit of claim 1, further comprising at least one second delay switching element having a source and drain connected in series between the reduced supply voltage and the first delay switching element, and a gate connected to the control line.

3. The power-on-reset circuit of claim 2, wherein the first delay switching element and the at least one second delay switching element are PMOS transistors.

4. The power-on-reset circuit of claim 1, further comprising at least one bias resistor coupled between the control line and the reference voltage.

5. The power-on-reset circuit of claim 4, wherein the biased switching element is a PMOS transistor, and the at least one bias resistor comprises two series connected resistors.

6. The power-on-reset circuit of claim 1, wherein the inverter includes a second CMOS inverter coupled between the supply voltage and the reference voltage, and an input of the second CMOS inverter is connected to the output of the first CMOS inverter.

7. A power-on-reset circuit for a system-on-chip (SOC), the power-on-reset circuit comprising:
- a biased switching element having a source, a drain, and a gate, wherein the source is connected to a supply voltage, and the drain and gate are connected to a control line;
- a plurality of delay switching elements having sources and drains thereof connected in series with one another and with a reduced supply voltage, each of the plurality of delay switching elements having a gate connected to the control line;
- an inverter having an input and an output, the inverter including a plurality of CMOS inverters having inputs and outputs thereof connected in series with one another between the input and the output of the inverter, wherein each of the CMOS inverters is coupled between the supply voltage and a reference voltage, the input of the inverter is connected to a drain of one of the plurality of delay switching elements;
- a first capacitor coupled between the inverter input and the reference voltage; and
- a second capacitor coupled between the inverter input and an output of a first one of the plurality of CMOS inverters in the series connection.

8. The power-on-reset circuit of claim 7, further comprising at least two series connected bias resistors coupled between the control line and the reference voltage.

9. The power-on-reset circuit of claim 7, wherein the delay switching elements and the biased switching element are PMOS transistors.

\* \* \* \* \*